(12) United States Patent
Hell et al.

(10) Patent No.: US 12,176,396 B2
(45) Date of Patent: *Dec. 24, 2024

(54) SEMICONDUCTOR DEVICE INCLUDING CURRENT SPREAD REGION

(71) Applicant: Infineon Technologies AG, Neubiberg (DE)

(72) Inventors: Michael Hell, Erlangen (DE); Rudolf Elpelt, Erlangen (DE); Thomas Ganner, Krumpendorf am Wörthersee (AT); Caspar Leendertz, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/076,774

(22) Filed: Dec. 7, 2022

(65) Prior Publication Data

US 2023/0101290 A1 Mar. 30, 2023

Related U.S. Application Data

(62) Division of application No. 17/031,358, filed on Sep. 24, 2020, now Pat. No. 11,552,170.

(30) Foreign Application Priority Data

Sep. 24, 2019 (DE) .......................... 102019125676.3

(51) Int. Cl.
*H01L 29/10* (2006.01)
*H01L 21/04* (2006.01)
(Continued)

(52) U.S. Cl.
CPC ........ *H01L 29/1045* (2013.01); *H01L 21/046* (2013.01); *H01L 29/1608* (2013.01);
(Continued)

(58) Field of Classification Search
CPC ............... H01L 29/1045; H01L 21/046; H01L 29/1608; H01L 29/66068; H01L 29/7806;
(Continued)

(56) References Cited

U.S. PATENT DOCUMENTS

| 11,552,170 B2 * | 1/2023 | Hell | H01L 29/1045 |
| 2015/0311279 A1 * | 10/2015 | Onozawa | H01L 29/32 |
| | | | 438/530 |
| 2018/0350961 A1 * | 12/2018 | Naito | H01L 29/407 |

* cited by examiner

*Primary Examiner* — Cuong B Nguyen
(74) *Attorney, Agent, or Firm* — Cooper Legal Group LLC

(57) ABSTRACT

A semiconductor device includes a silicon carbide semiconductor body. A first shielding region of a first conductivity type is connected to a first contact at a first surface of the silicon carbide semiconductor body. A current spread region of a second conductivity type is connected to a second contact at a second surface of the silicon carbide semiconductor body. A doping concentration profile of the current spread region includes peaks along a vertical direction perpendicular to the first surface. A doping concentration of one peak or one peak-group of the peaks is at least 50% higher than a doping concentration of any other peak of the current spread region. A vertical distance between the one peak or the one peak-group of the current spread region and the first surface is larger than a second vertical distance between the first surface and a maximum doping peak of the first shielding region.

20 Claims, 4 Drawing Sheets

(51) Int. Cl.
*H01L 29/16* (2006.01)
*H01L 29/66* (2006.01)
*H01L 29/78* (2006.01)

(52) U.S. Cl.
CPC .... *H01L 29/66068* (2013.01); *H01L 29/7806* (2013.01); *H01L 29/7813* (2013.01)

(58) Field of Classification Search
CPC . H01L 29/7813; H01L 29/1095; H01L 29/78; H01L 21/266; H01L 29/0607; H01L 27/14679; H01L 29/66431; H01L 29/66462; H01L 29/66893–66924; H01L 29/7832; H01L 29/8086; H01L 2924/13062; H01L 29/1058; H01L 29/1066; H01L 27/098; H01L 29/36–365
See application file for complete search history.

SEMICONDUCTOR DEVICE INCLUDING CURRENT SPREAD REGION

RELATED APPLICATION

This application claims priority to and is a divisional of U.S. application Ser. No. 17/031,358, filed on Sep. 24, 2020, entitled "SEMICONDUCTOR DEVICE INCLUDING CURRENT SPREAD REGION", which claims priority to German Patent Application No. 102019125676.3, filed on Sep. 24, 2019, entitled "SEMICONDUCTOR DEVICE INCLUDING CURRENT SPREAD REGION". U.S. application Ser. No. 17/031,358 and German Patent Application No. 102019125676.3 are incorporated by reference herein in their entirety.

TECHNICAL FIELD

The present disclosure is related to semiconductor devices, for example to silicon carbide (SiC) semiconductor devices and manufacturing methods therefor.

BACKGROUND

Technology development of SiC semiconductor devices, e.g., insulated gate field effect transistors (IGFETs) including field effect transistor cells, aims at reducing an area-specific on-state resistance $R_{DS(on)}$ without adversely affecting a blocking voltage capability $V_{DS}$ between load terminals, e.g., source and drain. Although one device characteristic may be improved by varying a certain device parameter, this may lead to deterioration of another device characteristic. As an example, the area-specific on-state resistance $R_{DS(on)}$ may be improved by, for instance, increasing a drift zone doping concentration, which may, however, lead to deterioration of the blocking voltage capability $V_{DS}$ between source and drain. Thus, device parameters are designed during technology development based on a number of tradeoffs to be met in view of target device specifications.

There is a need to improve semiconductor devices based on silicon carbide.

SUMMARY

An example of the present disclosure relates to a semiconductor device. The semiconductor device includes a silicon carbide semiconductor body. The semiconductor device further includes a first shielding region of a first conductivity type. The first shielding region is electrically connected to a first contact at a first surface of the silicon carbide semiconductor body. The semiconductor device further includes a current spread region of a second conductivity type. The current spread region is electrically connected to a second contact at a second surface of the silicon carbide semiconductor body. The first shielding region and the current spread region form a pn-junction. A doping concentration profile of the current spread region includes a plurality of peaks along a vertical direction perpendicular to the first surface. A doping concentration of one peak or one peak-group of the plurality of doping peaks is at least 50% higher than a doping concentration of any other one of the plurality of peaks of the current spread region. A first vertical distance between the one peak or the one peak-group of the current spread region and the first surface may be larger than a second vertical distance between the first surface and a maximum doping peak of the first shielding region along the vertical direction.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of SiC semiconductor devices and methods of manufacturing a silicon carbide device and together with the description serve to explain principles of the examples. Further examples are described in the following detailed description and the claims.

DETAILED DESCRIPTION

Figure 1:
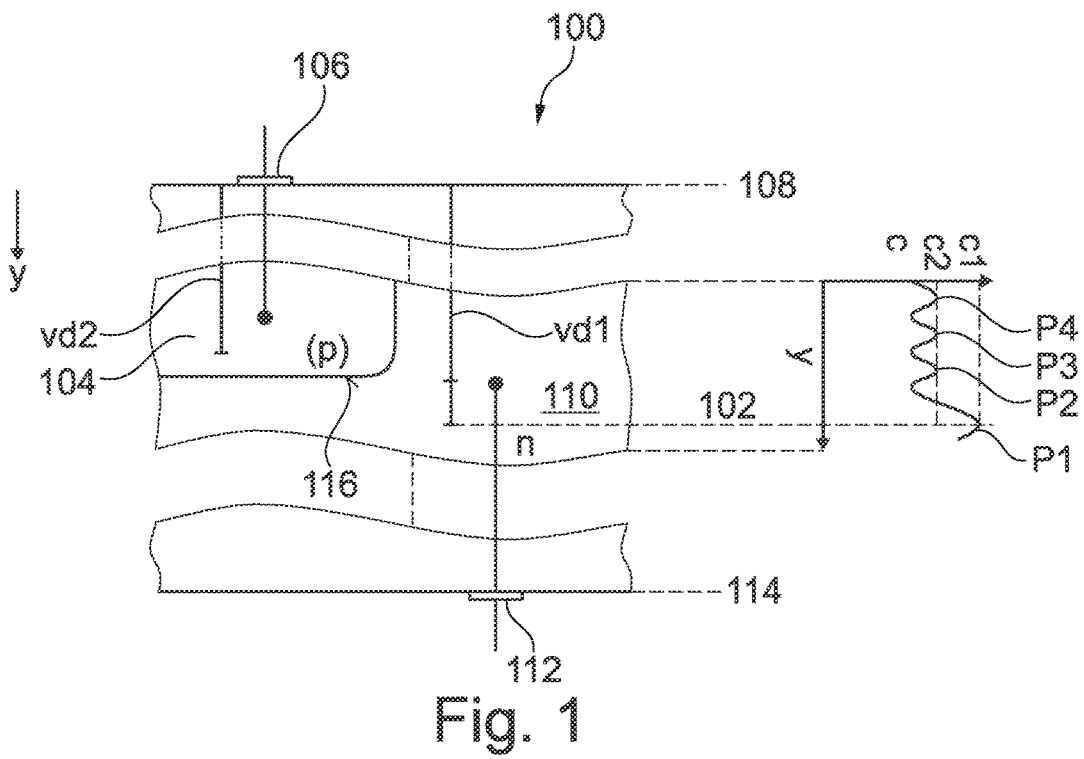
FIG. 1 is a schematic cross-sectional view for illustrating a SiC semiconductor device including a current spread region.

In the following detailed description, reference is made to the accompanying drawings, which form a part hereof and in which are shown by way of illustrations specific examples in which SiC semiconductor devices and methods of manufacturing a silicon carbide device may be practiced. It is to be understood that other examples may be utilized and structural or logical changes may be made without departing from the scope of the present disclosure. For example, features illustrated or described for one example can be used on or in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening elements adapted for signal and/or power transmission may be connected between the electrically coupled elements, for example, elements that are controllable to temporarily provide a low-resistive connection in a first state and a high-resistive electric decoupling in a second state.

An ohmic contact is a non-rectifying electrical junction with a linear or almost linear current-voltage characteristic. A Schottky contact is a metal-semiconductor junction with rectifying characteristics, wherein the work function of the metal and the dopant concentration in the semiconductor material are selected such that in the absence of an externally applied electric field a depletion zone forms in the semiconductor material along the metal-semiconductor junction. In the context of a Schottky contact, the term "metal-semiconductor junction" may also refer to a junction between a metal-like semiconductor and a semiconductor, wherein the junction has the same characteristics as a metal-semiconductor junction. For example, it may be possible to form a Schottky contact between polycrystalline silicon and silicon carbide. If two components (e.g., two regions) form an ohmic contact or a Schottky contact, respectively, this may mean that an ohmic contact or a Schottky contact is present between said two components. In both cases, it may be possible for said two regions to directly adjoin each other. However, it may also be possible that a further component is positioned between said two components.

Ranges given for physical dimensions include the boundary values. For example, a range for a parameter y from a to b reads as a≤y≤b. The same holds for ranges with one boundary value like "at most" and "at least".

Main constituents of a layer or a structure from a chemical compound or alloy are such elements which atoms form the chemical compound or alloy. For example, silicon (Si) and carbon (C) are the main constituents of a silicon carbide (SiC) layer.

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

An example of a semiconductor device may include a silicon carbide semiconductor body. The semiconductor device may further include a first shielding region of a first conductivity type. The first shielding region may be electrically connected to a first contact at a first surface of the silicon carbide semiconductor body. The semiconductor device may further include a current spread region of a second conductivity type. The current spread region may be electrically connected to a second contact at a second surface of the silicon carbide semiconductor body. The first shielding region and the current spread region may form a pn-junction. A doping concentration profile of the current spread region may include a plurality of peaks along a vertical direction perpendicular to the first surface.

A doping concentration of one peak or one peak-group (that is to say, each of the peaks of the peak-group) of the plurality of doping peaks may be at least 50% higher than a doping concentration of any other one of the plurality of peaks of the current spread region. A peak may be a single maximum of the doping concentration, for example in a cross-section of the semiconductor device. A peak in the doping concentration may be generated, for instance, by a single-shot ion implantation with a sufficiently high ion concentration or by a plurality of shots. In the latter case, each of the plurality of shots may have a lower concentration compared to a single-shot ion implantation but approximately the same implantation energy. In addition or as an alternative, several peaks may arise from one single-shot implantation, e.g., in combination with an angle sweep. This may be a consequence of a channeling effect.

A peak-group may comprise at least two peaks (e.g., exactly two peaks). Neighboring peaks of a peak-group may overlap and/or merge at least partially. The doping concentration of a peak-group is, for example, the average doping concentration of all peaks of said peak-group. For example, the doping concentration of each of the peaks of the peak-group may be at least 50% higher than an average doping concentration of all other peaks of the plurality of peaks of the current spread region.

A first vertical distance between the one peak or the one peak-group of the current spread region and the first surface may be larger than a second vertical distance between the first surface and a maximum doping peak of the first shielding region along the vertical direction.

The silicon carbide semiconductor body may be a crystalline semiconductor substrate. For example, the silicon carbide crystal may have a hexagonal polytype, e.g., 4H or 6H. The silicon carbide semiconductor body may be homogeneously doped or may include differently doped SiC layer portions. The silicon carbide semiconductor body may include one or more layers from another material with a melting point close to or higher than crystalline silicon carbide. For example, the layers from another material may be embedded in the crystalline silicon carbide substrate.

The silicon carbide semiconductor body may have two essentially parallel main surfaces of the same shape and size and a lateral surface area connecting the edges of the two main surfaces. For example, the silicon carbide semiconductor body may be a rectangular prism with or without rounded edges or a right cylinder or a slightly oblique cylinder (e.g., where the sides lean with an angle of at most 8° or at most 5° or at most 3°) with or without one or more flats and/or notches along the outer circumference.

The silicon carbide semiconductor body may laterally extend in a plane spanned by lateral directions (also called "horizontal directions").

Perpendicular to the lateral directions, in a vertical direction, the silicon carbide semiconductor body may have a thickness that is small compared to the respective extension of the silicon carbide semiconductor body in the lateral directions. The lateral directions may run parallel to the main surfaces or may enclose an angle of at most 10° or at most 8° or at most 5° with at least one of the main surfaces.

The first shielding region may include a bottom portion and a top portion, wherein the top portion is between the first surface and the bottom portion. Each of the bottom and top portion of the first shielding region may include a plurality of doping peaks. For example, a mean doping concentration averaged along a vertical extent of the top portion may differ from, e.g., be higher or lower than, a mean doping concentration averaged along a vertical extent of the bottom portion. A shielding region may include a plurality of laterally spaced shielding regions, e.g., including the first and a second, third, fourth and so forth shielding region of neighboring transistor cells. The plurality of laterally spaced shielding regions may be concurrently formed by a masked ion implantation process, for example. The mask pattern may define a lateral distance of the first and second shielding regions, for example. Neighboring bottom portions of the laterally spaced shielding regions may be considered as, or function similar to, part of a junction field effect transistor (JFET) having the current spread region and/or a drift region as part of a channel region. A conductivity of the channel region of the JFET may depend on a blocking voltage between the shielding region and the current spread region and/or the drift region, e.g., a blocking voltage between load contacts of the semiconductor device. When space charge regions between the current spread region/drift region and opposite bottom portions of the laterally spaced first and second shielding regions expand toward each other, e.g., when increasing a blocking voltage between load contacts of the semiconductor device, a channel conductivity of the JFET may decrease, for example.

The doping profile of the current spread region may be formed by an unequal weighting of ion implantation doses used to form the current spread region. For example, a dose of the deepest ion implantation for the current spread region may be increased at the expense of the one or more ion implantations of the current spread region that are formed by lower ion implantation energies, i.e., closer to the first surface.

For example, a total ion implantation dose for that section of the current spread region that is part of the JFET may be kept constant with respect to a total ion implant dose that is split into implants having equal doses. If the semiconductor device comprises a trench gate structure that comprises a gate dielectric (e.g., a gate oxide), keeping the total ion implantation dose constant may facilitate and/or enable keeping a maximum electric field in the gate dielectric at a bottom of the trench gate structure constant. This may allow for improving a tradeoff between an area-specific on-state resistance $R_{on}xA$ and maximum electric field in the gate oxide in blocking mode, for example.

For example, the current spread region may adjoin a bottom of the first shielding region. The pn-junction may be formed between the current spread region and the bottom of the first shielding region. Moreover, the current spread region may also adjoin a side face, e.g., a lateral face, of the first shielding region. Thus, the pn-junction may extend from the bottom of the first shielding region along the side face to a bottom of a body region. The pn-junction may end at a gate dielectric of a trench gate structure of the semiconductor device, for example.

For example, the semiconductor device may further include a drift region. The drift region may adjoin a bottom of the current spread region. A top of the current spread region may adjoin a body region, for example. A doping concentration of the one peak or the peaks of the one peak-group may be at least a factor of 5, or a factor of ten (one order of magnitude), or at least a factor of hundred (two orders of magnitude), or a factor of 500 higher than a minimum doping concentration in the drift region, e.g., a factor ranging from 5 to 500. Exemplary values for a mean net dopant concentration in the drift region may be in the range from $10^{15}$ centimeters $(cm)^{-3}$ to $5 \times 10^{16}$ $cm^{-3}$. A mean net dopant concentration in the current spread region may be higher than the mean net dopant concentration in the drift region, e.g., by a factor ranging from 2 to 200, or a factor ranging from 3 to 100, or a factor ranging from 5 to 50, for example. Arrangement of the current spread region may allow for a further reduction of the area-specific on-state resistance $R_{on}xA$, for example.

For example, a number of the plurality of peaks in the doping concentration profile of the current spread region may range from 3 to 20, or from 4 to 15, or from 5 to 10, for example. The number of the plurality of peaks may be adjusted in view of a target vertical extent of the current spread region and profiles of implanted dopants that may be diffusion-broadened by a thermal budget during manufacture of the semiconductor device, for example.

For example, the first vertical distance between the one peak or the one peak-group of the current spread region and the first surface may be larger than a vertical distance between any other one of the plurality of doping peaks of the current spread region and the first surface. A vertical profile of the current spread region may thus decrease from the one peak or the one peak-group toward a doping level of the drift zone, for example. According to another example, one or more peaks having a lower doping concentration than the one peak or the one peak-group may be arranged at a larger vertical distance to the first surface than the one peak or the one peak-group.

For example, the first vertical distance may be larger than a third vertical distance between a bottom of the first shielding region and the first surface. According to another example, the first vertical distance may be smaller than a third vertical distance between a bottom of the first shielding region and the first surface.

For example, the semiconductor device may further comprise a body region of the first conductivity type. A top of the current spread region may adjoin a bottom of the body region. A channel current flowing in a channel region close to an interface between the body region and a gate dielectric may directly enter the current spread region and be conducted though the drift zone to a second contact at a second surface of the semiconductor body. The second surface is opposite to the first surface, for example.

For example, the semiconductor device may further comprise a trench gate structure. The body region may adjoin (e.g., directly adjoin) a first sidewall of the trench gate structure and the first shielding region may adjoin (e.g., directly adjoin) a second sidewall of the trench gate structure opposite to the first sidewall. For example, the body region may adjoin (e.g., directly adjoin) the trench gate structure at the first sidewall (e.g., only at the first sidewall) but not at the second sidewall. For example, the shielding region may adjoin (e.g., directly adjoin) the trench gate structure at the second sidewall (e.g., only at the second sidewall) but not at the first sidewall. In some other examples, the body region may adjoin the first sidewall and the second sidewall, respectively. Thus, a channel current may flow along each one of opposite sidewalls of the trench gate structure. The body region may comprise at least two sub-regions, for example. At least one of the sub-regions may adjoin the first sidewall and another one of the sub-regions may adjoin the second sidewall.

The trench gate structure may include a gate dielectric and a gate electrode. The gate dielectric may separate the gate electrode from the silicon carbide semiconductor body along at least one side of the trench gate structure. The gate dielectric may include or consist of thermally grown or deposited silicon oxide, silicon nitride, silicon oxynitride, another deposited dielectric material or any combination thereof. A thickness of the gate dielectric may be adjusted for setting a threshold voltage in a range from 1.0 V to 8 V, for example. The trench gate structure may exclusively include the gate electrode and the gate dielectric or may include further conductive and/or dielectric structures in addition to the gate electrode and the gate dielectric. The gate electrode and any optional additional auxiliary electrode may include or consist of an electrode material or a combination of electrode materials, for example a doped semiconductor material (e.g., a degenerate doped semiconductor material) such as doped polycrystalline silicon, metal or metal compound, for example. The gate electrode may also include a combination of these materials, e.g., a liner material and a metal filling such as titanium nitride (TiN) and tungsten (W).

For example, the semiconductor device may further comprise a second shielding region of the first conductivity type. The first and second shielding regions may be concurrently formed as laterally spaced parts of a shielding region, e.g., by at least one masked ion implantation process. At least a top part of the current spread region is arranged between the first shielding region and the second shielding region along a lateral direction perpendicular to the vertical direction. The top part of the current spread region may be part of a diode region, for example. The first and second shielding regions may be part of a JFET having a part of the current spread region as a channel region. A conductivity of the channel region of the JFET may be modified by a space charge region at the pn-junction formed between the current spread region and the first and second shielding regions, respectively, for example.

For example, the semiconductor device may further comprise a diode region of the second conductivity type. The diode region may adjoin the first surface. At least part of a vertical doping concentration profile of the diode region along the vertical direction may be equal to at least part of a vertical doping concentration profile of the current spread region. For example, the diode region and the current spread region may be concurrently formed by ion implantation processes that may be unmasked at least with respect to a transistor cell area, for example. For example, the first shielding region may adjoin (e.g., directly adjoin) the second sidewall of a trench gate structure at a first side of the first shielding region. The first shielding region may further adjoin the diode region at a second side of the first shielding region, wherein the second side is opposite to the first side, for example.

For example, a total number of the plurality of peaks in the vertical doping concentration profile of the current spread region may be less than a total number of peaks in the vertical doping concentration profile of the diode region. For example, the diode region may extend up to the first surface of the semiconductor body, and a top of the current spread region may adjoin a bottom of the body region.

For example, the semiconductor device may further comprise an electrode adjoining the diode region at the first surface. The diode region and the electrode may form a Schottky contact. The electrode may include a metal or metal alloy forming a Schottky contact to the diode region, for example.

In at least one operational mode of the semiconductor device, e.g., a reverse conducting mode, a bipolar current including holes and electrons may flow through the silicon carbide body, wherein the bipolar current may pass at least a pn-junction of a transistor cell. In some examples, in the vicinity of the pn junctions and further, if applicable, in the vicinity of unipolar junctions, holes and electrons may recombine at a more than insignificant rate. The recombination may set free energy (e.g., thermal energy) and/or momentum that may promote bipolar degradation. Bipolar degradation denotes the growth of preexisting crystallographic defects. For example, BPD (basal plane dislocations) between neighboring lattice planes may transform into SSFs (Shockley stalking faults) which grow along the lattice planes in a direction that is predominately transversal to a vertical load current flow through the silicon carbide body such that the lattice defects may more and more impede the vertical load current flow through the silicon carbide body.

In some examples, a forward voltage drop across a Schottky contact in silicon carbide may be lower than a forward voltage drop across a pn-junction in silicon carbide such that a reverse current through the silicon carbide body may predominantly flow through the Schottky contact. This may allow for increasing a maximum current in unipolar operation, and thus to shift undesired bipolar operation to higher threshold voltages, for example. This may allow for counteracting or suppressing bipolar degradation in the semiconductor device, for example.

For example, the semiconductor device may further comprise a gate structure extending along a first lateral direction.

The first lateral direction may be a longitudinal direction of a stripe-shaped trench or planar gate structure, for example. The semiconductor device may further comprise a plurality of source regions arranged (e.g., subsequently arranged) along the first lateral direction at a lateral distance from each other (e.g., the plurality of source regions may be arranged with intervals, about equal to the lateral distance, between pairs of source regions).

For example, the semiconductor device may further comprise a plurality of body regions arranged (e.g., subsequently arranged) along the first lateral direction at a lateral distance from each other (e.g., the plurality of body regions may be arranged with intervals, about equal to the lateral distance, between pairs of body regions). This may allow for spreading a channel current not only along a lateral direction perpendicular to the first lateral direction of the gate structure, but also along the first lateral direction, e.g., longitudinal direction of the gate structure. For example, the shielding region may be arranged between some or all of the body regions that are arranged (e.g., subsequently arranged) along the longitudinal direction of the gate structure. In addition or as an alternative, at least one Schottky contact region may be arranged between at least two or all of the body regions that are subsequently (e.g., subsequently arranged) arranged along the longitudinal direction of the gate structure.

According to an example, the semiconductor device may further comprise at least two source regions. The diode region may be located between the at least two source regions.

An example of a method of manufacturing the semiconductor device as described in the examples above may include forming the current spread region by a plurality of ion implantations of dopants having different ion implantation energies. An ion implantation of the plurality of ion implantations has a highest ion implantation energy among the plurality of ion implantations and an ion implantation dose of the ion implantation may be greater than an ion implantation dose of any other ion implantation of the plurality of ion implantations. For example, the ion implantation dose of the ion implantation may be at least a factor of 1.5, or a factor of 2, or a factor of 3 greater, and at most a factor of 50, or a factor of 25, or a factor of 10 greater than an ion implantation dose of any other ion implantation of the plurality of ion implantations.

The examples described above may be examples of a power semiconductor device or examples for manufacturing a power semiconductor device, e.g., a silicon carbide power semiconductor device. The power semiconductor device or an electrical structure (e.g., transistor of the silicon carbide device) of the power semiconductor device may have a breakdown voltage or blocking voltage of more than 100 V (e.g., a breakdown voltage of 200 V, 300 V, 400V or 500V) or more than 500 V (e.g., a breakdown voltage of 600 V, 5 700 V, 800V or 1000V) or more than 1000 V (e.g., a breakdown voltage of 1200 V, 1500 V, 1700V, 2000V, 3300V or 6500V), for example.

The examples and features described above and below may be combined.

Some of the above and below examples are described in connection with a silicon carbide substrate. Alternatively or in addition, a wide band gap semiconductor substrate, e.g., a wide band gap wafer, may be processed, e.g., comprising a wide band gap semiconductor material different from silicon carbide. The wide band gap semiconductor wafer may have a band gap larger than the band gap of silicon (1.1 electron volts (eV)). For example, the wide band gap semiconductor wafer may be a silicon carbide (SiC) wafer, or gallium arsenide (GaAs) wafer, or a gallium nitride (GaN) wafer.

More details and aspects are mentioned in connection with the examples described above or below. Processing the wide band gap semiconductor wafer may comprise one or more optional additional features corresponding to one or more aspects mentioned in connection with the proposed concept or one or more examples described above or below.

The aspects and features mentioned and described together with one or more of the previously described examples and figures, may as well be combined with one or more of the other examples in order to replace a like feature of the other example or in order to additionally introduce the feature to the other example.

The methods may be applied for manufacturing the semiconductor device as described with respect to any of the above examples or any of the examples described below in connection with the figures. In at least some examples of the method, some or all of the following features (if applicable) apply, alone or in combination:

(i) forming the source region, the body region, the current spread region, the diode region and/or the shielding region may include at least one masked or unmasked ion implantation process;

(ii) the diode region may be formed by more ion implantation processes than the current spread region;

(iii) at least part of the diode region may be concurrently formed with the current spread region by a plurality of ion implantation processes;

(iv) at least part of the ion implantation processes for forming the current spread region may be unmasked with respect to a transistor cell area of an IGFET;

(iv) body regions may be laterally spaced from one another along a longitudinal direction of a gate structure by at least one masked ion implantation process;

(v) source regions may be laterally spaced from one another along a longitudinal direction of a gate structure by at least one masked ion implantation process.

It will be appreciated that while the method is described above and below as a series of acts, steps or events, the described ordering of such acts, steps or events are not to be interpreted in a limiting sense. Rather, some acts, steps may occur in different orders and/or concurrently with other acts, steps or events apart from those described above and below.

Functional and structural details described with respect to the examples above shall likewise apply to the exemplary examples illustrated in the figures and described further below.

Referring to the schematic cross-sectional view of FIG. 1, an example of a semiconductor device 100 is illustrated.

The semiconductor device 100 includes a silicon carbide semiconductor body 102. A p-doped first shielding region 104 is electrically connected to a first contact 106 at a first surface 108 of the silicon carbide semiconductor body 102. The first contact 106 may adjoin (e.g., directly adjoin) the silicon carbide semiconductor body 102 at the first surface 108. The first contact 106 may further include or consist of a conductive material or a combination of conductive materials, for example a doped semiconductor material (e.g., a degenerate doped semiconductor material) such as doped polycrystalline silicon, metal or metal compound, for example. The first contact 106 may also include a combination of these materials, e.g., a liner or adhesion material and an electrode material. Exemplary contact materials include one or more of titanium nitride (TiN) and tungsten (W), aluminum (Al), copper (Cu), alloys of aluminum or copper, for example AlSi, AlCu or AlSiCu, nickel (Ni), titanium (Ti), tungsten (W), tantalum (Ta), silver (Ag), gold (Au), platinum (Pt), palladium (Pd), for example. The first contact 106 may constitute or be part of a wiring area formed over the silicon carbide semiconductor body 102. The wiring area may include one, two, three, or more than three wiring levels that may include patterned or non-patterned metal layers and interlayer dielectrics arranged between the patterned or non-patterned metal layers. Vias may electrically interconnect the different wiring levels, for example.

The semiconductor device 100 further includes an n-doped current spread region 110. The current spread region 110 is electrically connected to a second contact 112 at a second surface 114 of the silicon carbide semiconductor body 102. Exemplary contact materials described for the first contact 106 above likewise apply to the second contact 112. The first shielding region 104 and the current spread region 110 form a pn-junction 116.

A profile of a doping concentration c of the current spread region 110 includes a plurality of peaks P1, P2, P3, P4 along a vertical direction y perpendicular to the first surface 108. A doping concentration c1 of one peak or of all peaks of one peak-group P1 of the plurality of doping peaks P1, P2, P3, P4 is at least 50% higher than a doping concentration of any other one of the plurality of peaks of the current spread region 110, e.g., doping concentration c2 of peaks P2, P3, P4 illustrated in FIG. 1. In the schematic illustration of the profile of doping concentration c of the current spread region 110 in FIG. 1, the number of peaks is four and the peaks P2, P3, P4 are illustrated with equal doping concentration c2. The doping concentrations of the peaks P2, P3, P4 may also differ from one another and the number of peaks may also be greater or less than four.

A first vertical distance vd1 between the one peak or the one peak-group P1 of the current spread region 110 and the first surface 108 is larger than a second vertical distance vd2 between the first surface 108 and a maximum doping peak of the first shielding region 104 along the vertical direction y.

The semiconductor device 100 may be a vertical semiconductor device. In a vertical semiconductor device, a load current may flow along the vertical direction y between the first contact 106 at the first surface 108 and the second contact 112 at the second surface 114, for example. The first contact 106 may be a first load terminal, e.g., an anode terminal of a MCD (MOS controlled diode), a source terminal of an IGFET or an emitter terminal of an IGBT. The second contact 112 may be a second load terminal L2, e.g., a cathode terminal of a MCD, a drain terminal of an IGFET or a collector terminal of an IGBT, by way of example.

Figure 2A:
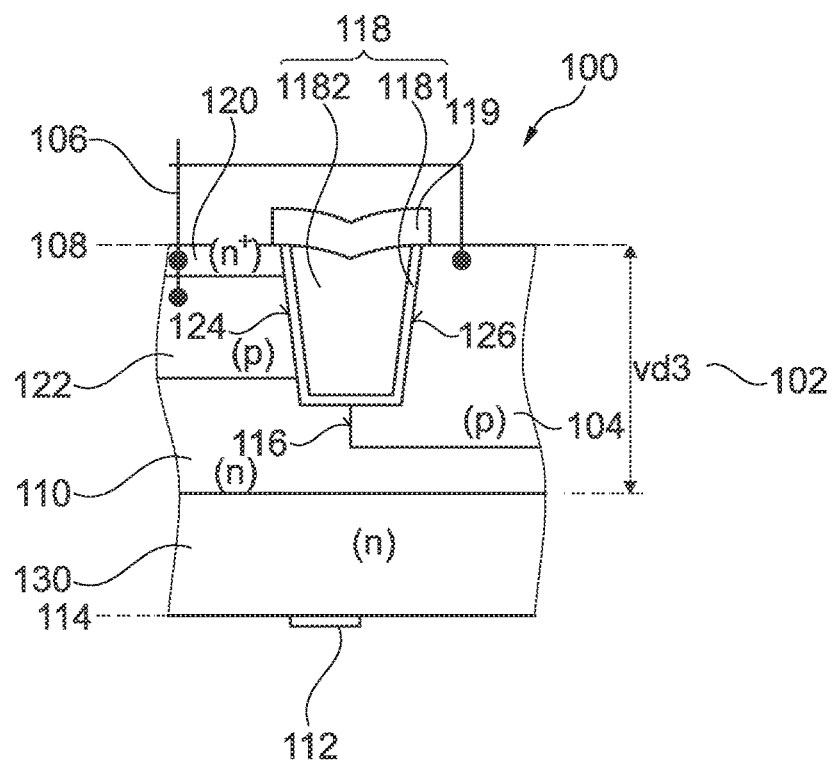
FIGS. 2A to 6 are schematic cross-sectional and plan views for illustrating examples of SiC semiconductor devices that are based on the example of FIG. 1.

Referring to the schematic cross-sectional view of FIG. 2A, another example of a semiconductor device 100 is illustrated. The example is based on the example of FIG. 1, but partly illustrated in more detail. The semiconductor device 100 may be or may include an IGFET (insulated gate field effect transistor), for example a MOSFET (metal oxide semiconductor FET).

The semiconductor device 100 includes a trench gate structure 118 extending from the first surface 108 into the silicon carbide semiconductor body 102 along the vertical direction y. The trench gate structure 118 includes a gate dielectric 1181 and a gate electrode 1182. An interlayer dielectric 119 is arranged on the gate electrode 1182. The interlayer dielectric 119 electrically insulates the gate electrode 1182 from conductive elements in a wiring area above the silicon carbide semiconductor body 102, for example.

An n+-doped source region 120 and a p-doped body region 122 adjoin a first sidewall 124 of the trench gate structure 118. The n+-doped source region 120 and the p-doped body region 122 are electrically connected to the first contact 106, e.g., a source electrode. The first contact 106 may be formed in a wiring area (not illustrated in FIG. 1) above the first surface 108, for example. For example, a highly doped body contact region may be arranged between the body region 122 and the first contact 106 for improving an ohmic contact between the body region 122 and the first contact 106. For example, the source region 120 and the body region 122 may be electrically connected to the first contact 106 at source contact areas and body contact areas at the first surface 108, respectively. These contact areas may alternate along a longitudinal direction of the trench gate structure 118 at the first surface 108. Alternatively or in addition, a groove contact extending into the silicon carbide semiconductor body 102 may be electrically connected to the body region 122 and/or to the body contact region at a bottom side, and optionally at the sidewalls, of the groove contact. The groove contact may also be electrically connected to the source region 120 at the sidewalls of the groove contact. For example, the body region 122 may adjoin (e.g., directly adjoin) the trench gate structure 118 at the first sidewall 124 (e.g., only at the first sidewall 124) but not at the second sidewall 126. For example, the source region 120 may adjoin (e.g., directly adjoin) the trench gate structure 118 at the first sidewall 124 (e.g., only at the first sidewall 124) but not at the second sidewall 126.

A conductivity of a channel close to an interface between the body region 122 and the gate dielectric 1181 may be controlled by a voltage applied to the gate electrode 1181, for example.

The p-doped first shielding region 104 adjoins a second sidewall 126 of the trench gate structure 118 opposite to the first sidewall 124. The p-doped first shielding region 104 adjoins a bottom of the trench contact structure 108.

The current spread region 110 may be formed as described with respect to the examples above. An n-doped drift region 130 is arranged between the current spread region 110 and the second surface 114.

Figure 2B:
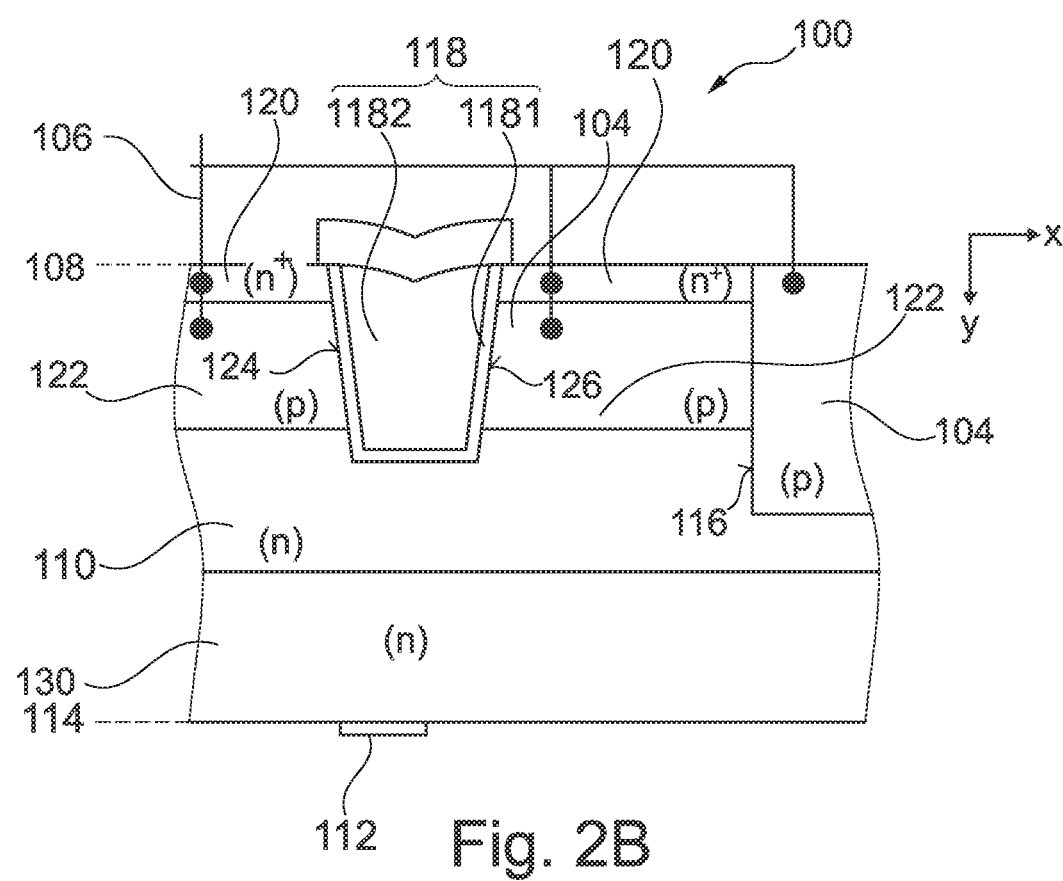

The example illustrated in FIG. 2B also includes one or more sections along the longitudinal direction of the trench gate structure 118 where the body region 122 also adjoins the second sidewall 126. Thus, channel currents may flow along the opposite first and second sidewalls of the trench gate structure 118, for example.

Figure 3:
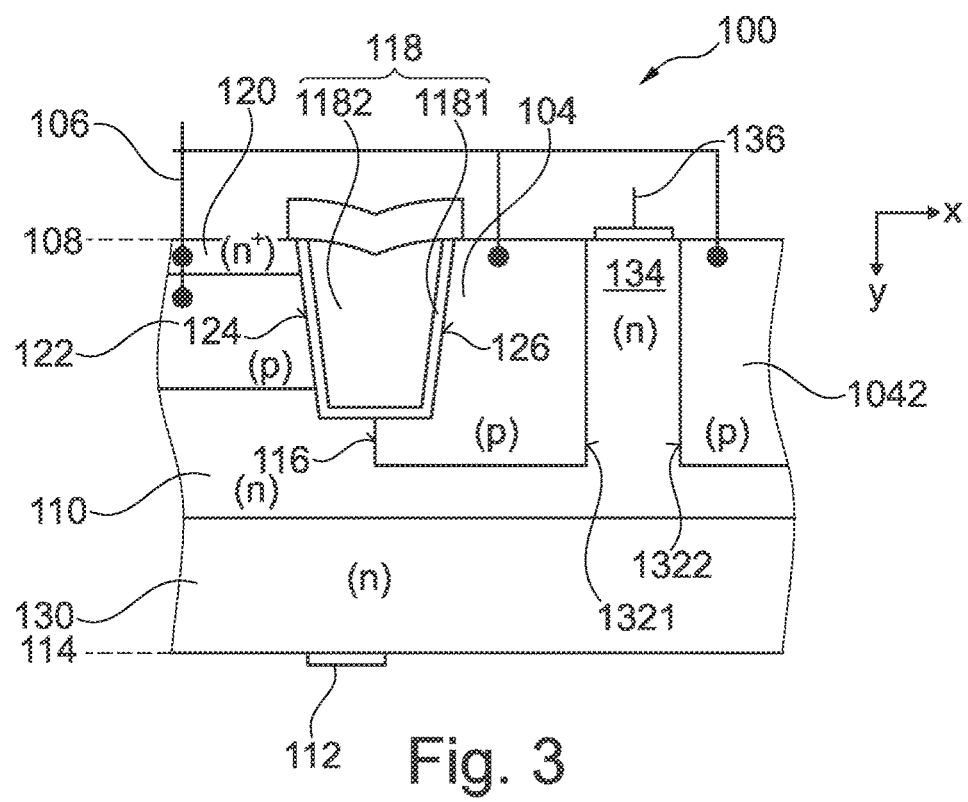

Referring to the schematic cross-sectional view of FIG. 3, another example of a semiconductor device 100 is illustrated. The example is based on the examples of FIGS. 1 and 2A, but partly illustrated in more detail.

The semiconductor device 100 further includes a p-doped second shielding region 1042. The first and second shielding regions 104, 1042 may be concurrently formed as laterally spaced parts of a shielding region, e.g., by at least one masked ion implantation process. A top part of the current spread region 110 is arranged between the first shielding region 104 and the second shielding region 1042 along a lateral direction perpendicular x to the vertical direction y. The first and second shielding regions 104, 1042 are part of a JFET having a part of the current spread region 110 as a channel region. A conductivity of the channel region of the JFET may be modified by a space charge region at a pn junction 1321, 1322 formed between the current spread region 110 and the first and second shielding regions 104, 1042, respectively, for example.

The semiconductor device 100 further includes an n-doped diode region 134. The diode region 134 adjoins the first surface 108. At least part of a vertical doping concentration profile of the diode region 134 along the vertical direction y is equal to at least part of a vertical doping concentration profile of the current spread region 110. For example, the diode region 134 and the current spread region 110 may be concurrently formed by ion implantation processes that may be unmasked, for example.

The semiconductor device 100 further includes an electrode 136 adjoining the diode region 134 at the first surface 108. The diode region 134 and the electrode 136 form a Schottky contact. The electrode 136 and the first contact 106 may be concurrently formed when forming a wiring area above the silicon carbide semiconductor body 102, for example.

Figure 4:
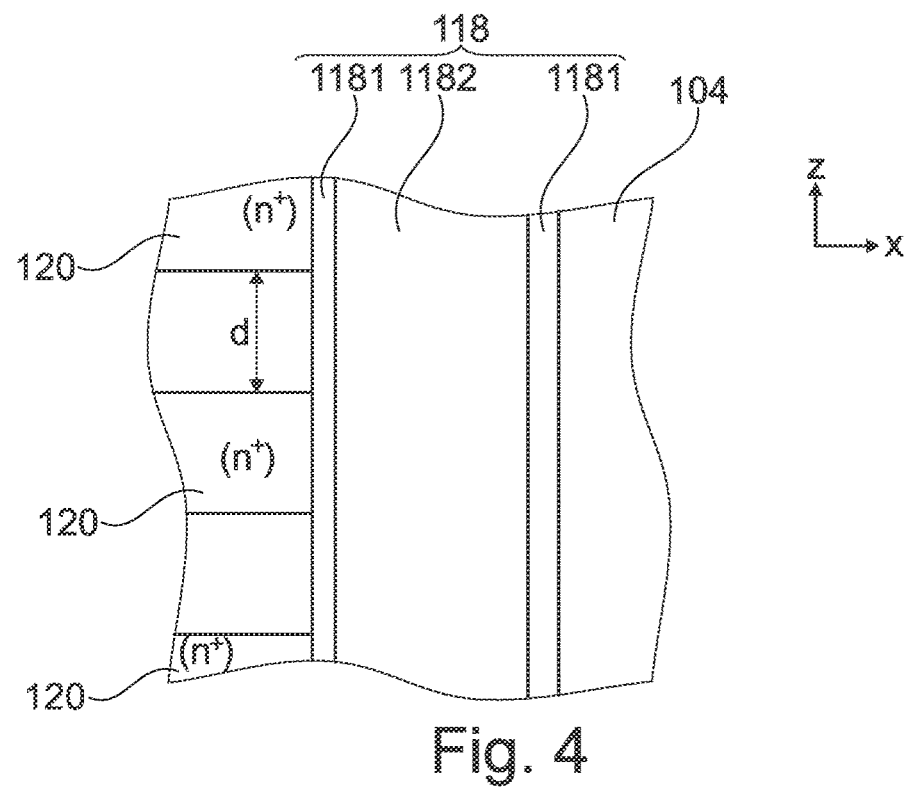

The trench gate structure 118 may be arranged as stripes extending along a longitudinal direction that extends perpendicular to the drawing plane of FIG. 3, for example. The source region 120 and/or the body region 122 may also be arranged as stripes extending along a longitudinal direction, for example. In some examples, e.g., as exemplary illustrated in the schematic plan view in FIG. 4, a plurality of source regions 120 are arranged (e.g., subsequently arranged) along a longitudinal direction z at a distance d from each other. In some embodiments, neighboring source regions 120 may be separated by at least one p-doped region, e.g., a diode region.

Figure 5:
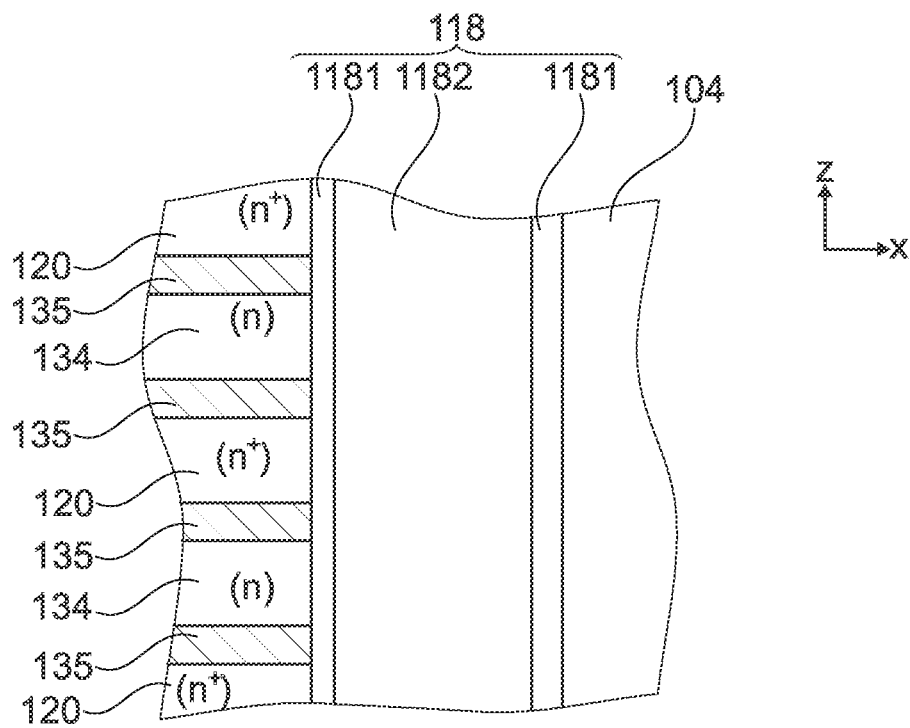

In the schematic plan view of FIG. 5, diode regions 134, e.g., for forming Schottky contact areas, are arranged between neighboring source regions 120 along the longitudinal direction of the gate trench structure 118. The diode regions 134 are electrically insulated from the source regions 120 by isolation regions 135, e.g., p-doped regions.

Figure 6:
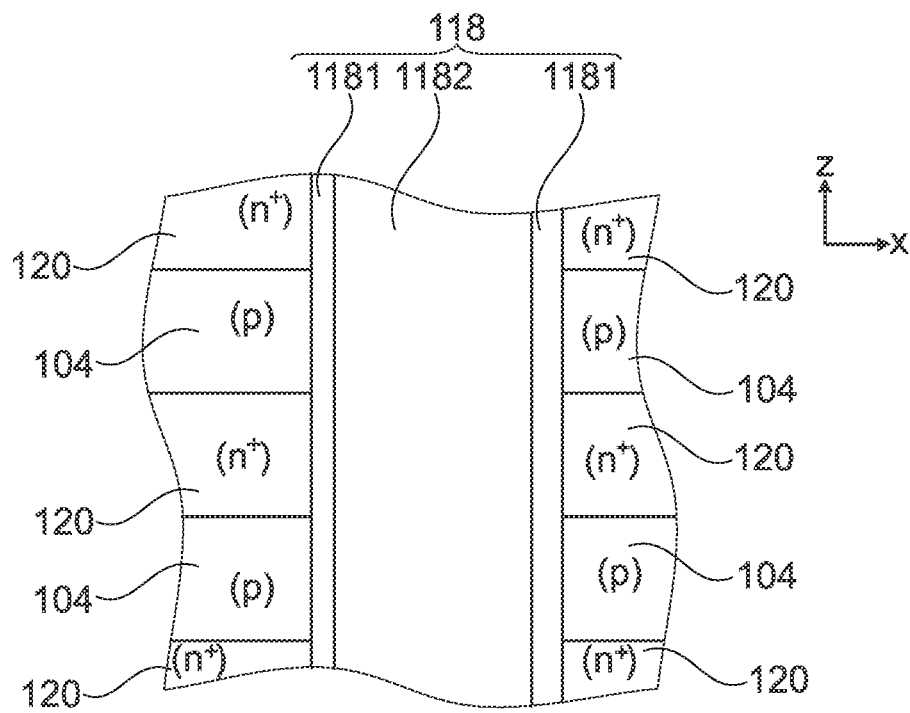

In the schematic plan view of FIG. 6, the first diode regions 104 are arranged between neighboring source regions 120 along the longitudinal direction of the gate trench structure 118.

The description and drawings merely illustrate the principles of the disclosure. Furthermore, all examples recited herein are principally intended expressly to be only for illustrative purposes to aid the reader in understanding the principles and the concepts of the present disclosure. All statements herein reciting principles, aspects, and examples of the disclosure, as well as specific examples thereof, are intended to encompass equivalents thereof. The first conductivity type may be n-type and the second conductivity type may be p-type. As an alternative, the first conductivity type may be p-type and the second conductivity type may be n-type.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that the present disclosure be limited only by the claims and the equivalents thereof.

What is claimed is:

1. A method of manufacturing a semiconductor device, the method comprising:
   forming a current spread region of a second conductivity type, wherein a first shielding region of a first conductivity type is electrically connected to a first contact at a first surface of a silicon carbide semiconductor body;
the current spread region is electrically connected to a second contact at a second surface of the silicon carbide semiconductor body;
the forming the current spread region comprises performing a plurality of ion implantations of dopants having different ion implantation energies;
an ion implantation of the plurality of ion implantations has a highest ion implantation energy among the plurality of ion implantations and an ion implantation dose of the ion implantation is greater than an ion implantation dose of any other ion implantation of the plurality of ion implantations; and
at least one of:
an electrode of a Schottky contact is formed over a diode region; or
the diode region is formed between the first shielding region and a second shielding region.

2. The method of claim 1, wherein the electrode of the Schottky contact is formed over the diode region.

3. The method of claim 1, wherein the diode region is formed between the first shielding region and the second shielding region.

4. The method of claim 1, comprising forming a source region of the semiconductor device.

5. The method of claim 4, wherein the source region is of the second conductivity type.

6. The method of claim 4, comprising forming a body region of the semiconductor device.

7. The method of claim 6, wherein the body region is between the source region and the current spread region.

8. A method of manufacturing a semiconductor device, the method comprising:
forming a current spread region of a second conductivity type, wherein
a first shielding region of the semiconductor device is of a first conductivity type, wherein the first shielding region is electrically connected, at least one of directly or via a metal different than a first contact, to the first contact at a first surface of a silicon carbide semiconductor body;
the current spread region is electrically connected to a second contact at a second surface of the silicon carbide semiconductor body;
a pn-junction is formed by (i) the first shielding region that is electrically connected, at least one of directly or via the metal, to the first contact and (ii) the current spread region;
a doping concentration profile of the current spread region comprises a plurality of peaks along a vertical direction perpendicular to the first surface, wherein a doping concentration of one peak or one peak-group of the plurality of peaks is higher than a doping concentration of any other one of the plurality of peaks of the doping concentration profile of the current spread region; and
a first vertical distance between the one peak or the one peak-group of the doping concentration profile of the current spread region and the first surface is larger than a second vertical distance between the first surface and a maximum doping peak of the first shielding region along the vertical direction.

9. The method of claim 8, wherein the current spread region adjoins a bottom of the first shielding region.

10. The method of claim 8, wherein the doping concentration of the one peak or the one peak-group is at least 50% higher than a doping concentration of any other one of the plurality of peaks.

11. The method of claim 8, wherein a number of the plurality of peaks in the doping concentration profile of the current spread region ranges from 3 to 20.

12. The method of claim 8, wherein the first vertical distance between the one peak or the one peak-group of the doping concentration profile of the current spread region and the first surface is larger than a vertical distance between any other one of the plurality of peaks of the doping concentration profile of the current spread region and the first surface.

13. The method of claim 8, comprising forming a source region of the semiconductor device.

14. The method of claim 13, comprising forming a body region of the semiconductor device.

15. The method of claim 14, wherein the body region is between the source region and the current spread region.

16. A method of manufacturing a semiconductor device, the method comprising:
forming a current spread region of a second conductivity type, wherein
a first shielding region of the semiconductor device is of a first conductivity type, wherein the first shielding region is electrically connected, at least one of directly or via a metal different than a first contact, to the first contact at a first surface of a silicon carbide semiconductor body;
the current spread region is electrically connected to a second contact at a second surface of the silicon carbide semiconductor body;
the current spread region adjoins a bottom of the first shielding region;
a pn-junction is formed by (i) the first shielding region that is electrically connected, at least one of directly or via the metal, to the first contact and (ii) the current spread region;
a doping concentration profile of the current spread region comprises a plurality of peaks along a vertical direction perpendicular to the first surface, wherein a doping concentration of one peak or one peak-group of the plurality of peaks is higher than a doping concentration of any other one of the plurality of peaks of the doping concentration profile of the current spread region; and
a first vertical distance between the one peak or the one peak-group of the doping concentration profile of the current spread region and the first surface is larger than a second vertical distance between the first surface and a maximum doping peak of the first shielding region along the vertical direction.

17. The method of claim 16, comprising forming a source region of the semiconductor device.

18. The method of claim 17, wherein the source region is of the second conductivity type.

19. The method of claim 17, comprising forming a body region of the semiconductor device.

20. The method of claim 19, wherein the body region is between the source region and the current spread region.

* * * * *